US012176683B2

(12) United States Patent
Noguchi et al.

(10) Patent No.: US 12,176,683 B2
(45) Date of Patent: Dec. 24, 2024

(54) LASER ELEMENT

(71) Applicant: Sharp Fukuyama Laser Co., Ltd., Fukuyama (JP)

(72) Inventors: Akinori Noguchi, Fukuyama (JP); Yoshihiko Tani, Fukuyama (JP); Hiroshi Nakatsu, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 559 days.

(21) Appl. No.: 17/527,616

(22) Filed: Nov. 16, 2021

(65) Prior Publication Data

US 2022/0158414 A1    May 19, 2022

(30) Foreign Application Priority Data

Nov. 18, 2020 (JP) ................. 2020-191712

(51) Int. Cl.
*H01S 5/22*  (2006.01)
*H01S 5/042* (2006.01)

(52) U.S. Cl.
CPC ............ *H01S 5/22* (2013.01); *H01S 5/04256* (2019.08)

(58) Field of Classification Search
CPC ........... H01S 5/22–2277; H01S 5/0421; H01S 5/20–2095; H01S 5/3211; H01S 5/3213
See application file for complete search history.

(56) References Cited

U.S. PATENT DOCUMENTS

| | | | |
|---|---|---|---|
| 9,590,389 B2 | 3/2017 | Hirao | |
| 10,333,278 B2 | 6/2019 | Vierheilig et al. | |
| 2017/0133822 A1 | 5/2017 | Hirao | |
| 2019/0013649 A1 | 1/2019 | Vierheilig et al. | |
| 2020/0076165 A1* | 3/2020 | Nagao | H01S 5/3406 |
| 2021/0184426 A1 | 6/2021 | Koyama et al. | |

FOREIGN PATENT DOCUMENTS

| | | | |
|---|---|---|---|
| CN | 115425112 | * 12/2022 | |
| JP | 2009088441 A | 4/2009 | |
| JP | 2010067763 A | 3/2010 | |
| JP | 2018-523311 A | 8/2018 | |
| TW | I237431 | * 8/2005 | ......... H01S 5/32341 |
| WO | 2019087524 A1 | 5/2019 | |

* cited by examiner

*Primary Examiner* — Xinning(Tom) Niu
*Assistant Examiner* — Delma R Forde
(74) *Attorney, Agent, or Firm* — ScienBiziP, P.C.

(57) ABSTRACT

A laser element comprises a substrate; and an n-type semiconductor layer, a light emitting layer, a p-type semiconductor layer, and an electrode layer successively laminated on one principal surface of the substrate, wherein the p-type semiconductor layer includes a ridge raised in a stripe shape, the ridge including a contact layer formed in a layer including a principal surface on a side opposite to the substrate, a stepped portion defined by recessing the contact layer is formed in at least part of a boundary between a lateral surface among surfaces defining outer edges of the ridge, the lateral surface extending along a lengthwise direction of the ridge, and the principal surface of the ridge, and the electrode layer covers the principal surface of the ridge and the stepped portion.

7 Claims, 5 Drawing Sheets

LASER ELEMENT

BACKGROUND

1. Field

An aspect of the present disclosure relates to a laser element in which a light emitting layer is made of a semiconductor.

2. Description of the Related Art

There is known a laser element in which a light emitting layer is made of a nitride semiconductor. Techniques for increasing the output of such a laser element have been promoted in recent years. In the following, when the expression "laser element" is used unless otherwise specified, it implies the laser element made of the nitride semiconductor.

For example, FIG. 1 in Specification of U.S. Pat. No. 10,333,278 and FIG. 1 of Japanese Unexamined Patent Application Publication (Translation of PCT Application) No. 2018-523311 illustrate a schematic sectional view of a laser element. As illustrated in those drawings, the laser element is constituted by laminating an n-type semiconductor layer, a light emitting layer, a p-type semiconductor layer, a p-side contact layer, and a p-side electrode layer on a substrate in order mentioned. In that laser element, the p-type semiconductor layer is formed in a uniform thickness.

The cross-section illustrated in FIG. 1 in Specification of U.S. Pat. No. 10,333,278 and FIG. 1 of Japanese Unexamined Patent Application Publication (Translation of PCT Application) No. 2018-523311 is a cross-section parallel to a lengthwise direction of a resonator constituting the laser element. In the following, the above-mentioned cross-section is called a longitudinal cross-section, and a cross-section perpendicular to the longitudinal cross-section is called a transverse cross-section.

Furthermore, as illustrated in FIG. 8 in Specification of U.S. Pat. No. 10,333,278 and FIG. 8 of Japanese Unexamined Patent Application Publication (Translation of PCT Application) No. 2018-523311, in an example of the laser element, the p-type semiconductor layer may include a ridge raised in a substantially stripe shape. The ridge has a stripe-shaped structure extending parallel to the longitudinal direction of the resonator and is formed in a greater thickness than a portion of the p-type semiconductor layer except for the ridge. The ridge is shaped into a substantially trapezoidal form when viewed in the transverse cross-section of the laser element.

In the following, of dimensions of the ridge, the dimension parallel to the longitudinal direction of the resonator (namely, the dimension along the longitudinal cross-section) is called a length, and the dimension perpendicular to the longitudinal direction of the resonator (namely, the dimension along the transverse cross-section) is called a width.

In the laser element disclosed in Specification U.S. Pat. No. 10,333,278 and Japanese Unexamined Patent Application Publication (Translation of PCT Application) No. 2018-523311 (see, for example, FIG. 1 in Specification of U.S. Pat. No. 10,333,278 and FIG. 1 of Japanese Unexamined Patent Application Publication (Translation of PCT Application) No. 2018-523311), a current protection region is disposed near an end surface (called "facet" in Specification of U.S. Pat. No. 10,333,278 and Japanese Unexamined Patent Application Publication (Translation of PCT Application) No. 2018-523311) of the resonator to drive the laser element with a higher current. In the current protection region, the p-side contact layer is removed, and the p-side electrode layer is in direct contact with the p-type semiconductor layer. In the following, of surfaces defining outer edges of the ridge, the surface perpendicular to the longitudinal direction of the resonator is called the end surface of the ridge, and the surface parallel to the longitudinal direction of the resonator is called a lateral surface of the ridge.

With the above-described configuration, a current flowing near the end surface in the longitudinal direction of the resonator can be suppressed, and hence non-radiative recombination can be suppressed which may occur near the end surface.

As another method of realizing a higher output of the laser element by increasing the current supplied to the laser element, it is conceivable to widen a width of the ridge and to increase an area of the ridge. With regard to the above-mentioned case, however, it has been found that, as the width of the ridge increases, a larger amount of current flows through the lateral surface of the ridge than through a central portion of the ridge. In the lateral surface, dangling bonds tend to generate, and many non-radiative recombination levels due to the dangling bonds are formed. The current flowing through the lateral surface of the ridge produces the non-radiative recombination without contributing to light emission, thus becoming heat and dissipating. The heat generation due to the non-radiative recombination not only reduces the output of the laser element when the laser element is driven with predetermined electric power, but also causes crystal defects near the lateral surface. Those crystal defects lead to a reduction in reliability of the laser element.

In consideration of the above-described problem, it is desirable, in a laser element in which a ridge is disposed in a p-type semiconductor layer, to improve drive efficiency and reliability of the laser element by suppressing a current flowing near a lateral surface of the ridge.

SUMMARY

According to one aspect of the disclosure, there is provided a laser element including a substrate, and an n-type semiconductor layer, a light emitting layer, a p-type semiconductor layer, and an electrode layer successively laminated on one principal surface of the substrate.

In the laser element according to the one aspect, the p-type semiconductor layer includes a ridge raised in a stripe shape, the ridge including a contact layer formed in a layer including a principal surface on a side opposite to the substrate, a stepped portion defined by recessing the contact layer is formed in at least part of a boundary between a lateral surface among surfaces defining outer edges of the ridge, the lateral surface extending along a lengthwise direction of the ridge, and the principal surface of the ridge, and the electrode layer covers the principal surface of the ridge and the stepped portion.

DESCRIPTION OF THE EMBODIMENTS

First Embodiment

Configuration of Laser Element

Figure 1:
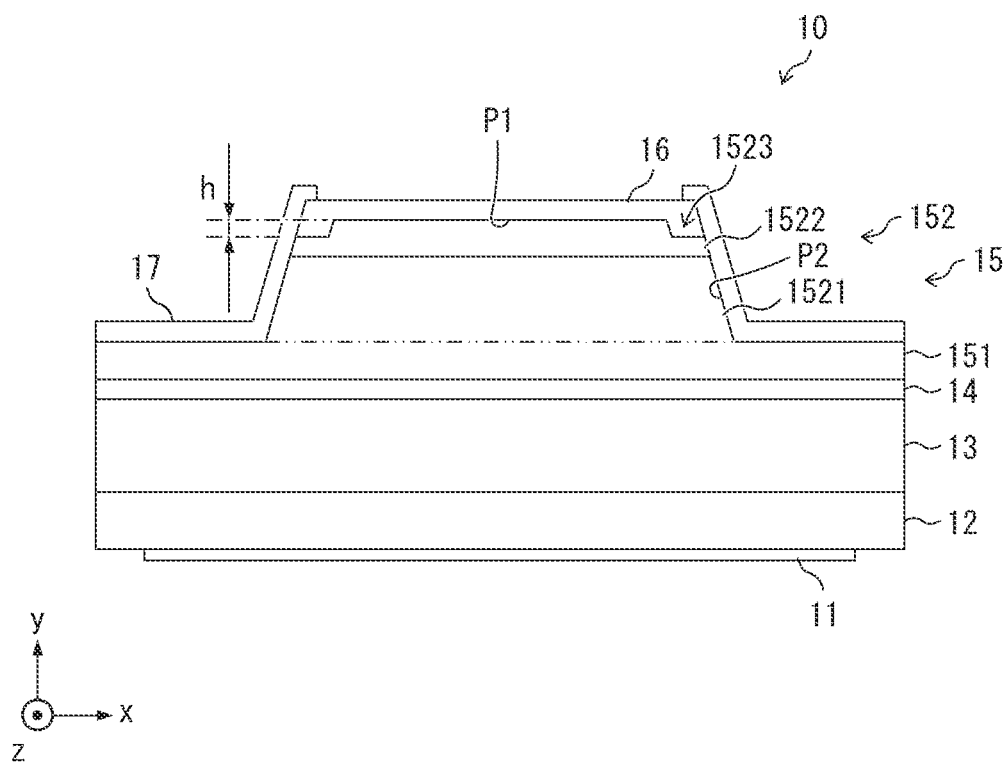
FIG. 1 is a front view of a laser element according to a first embodiment of the present disclosure.
Figure 2:
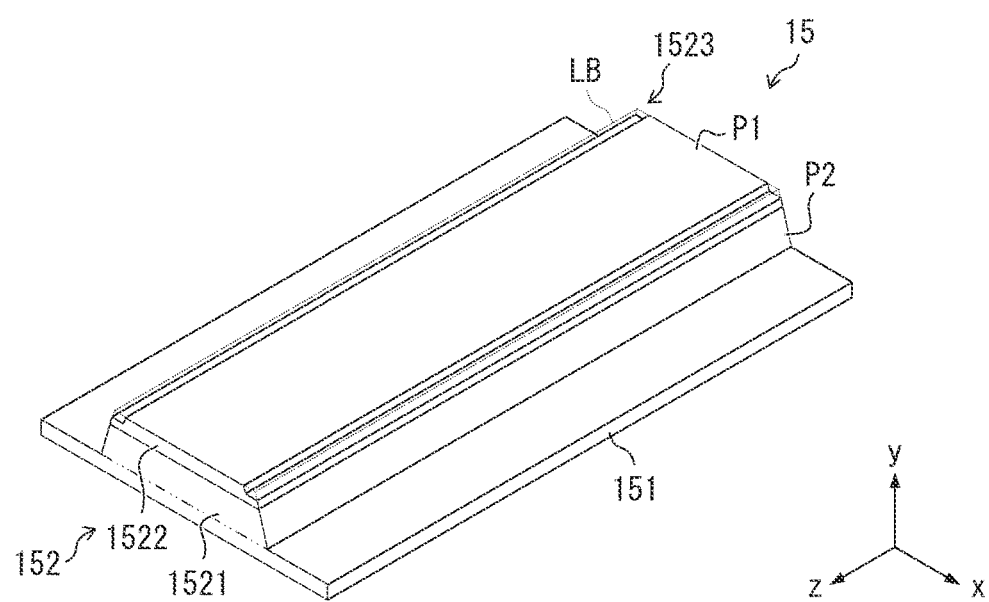
FIG. 2 is a perspective view of a p-type semiconductor layer included in the laser element illustrated in FIG. 1.
Figure 3:
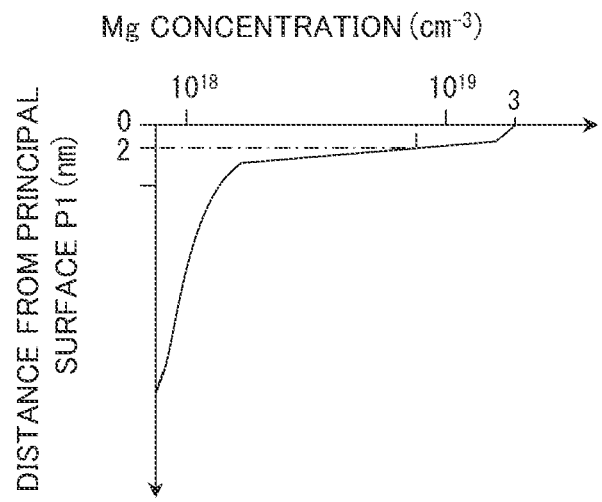
FIG. 3 is a graph depicting a distribution of Mg concentration in a ridge included in the p-type semiconductor layer illustrated in FIG. 2.
Figure 4:
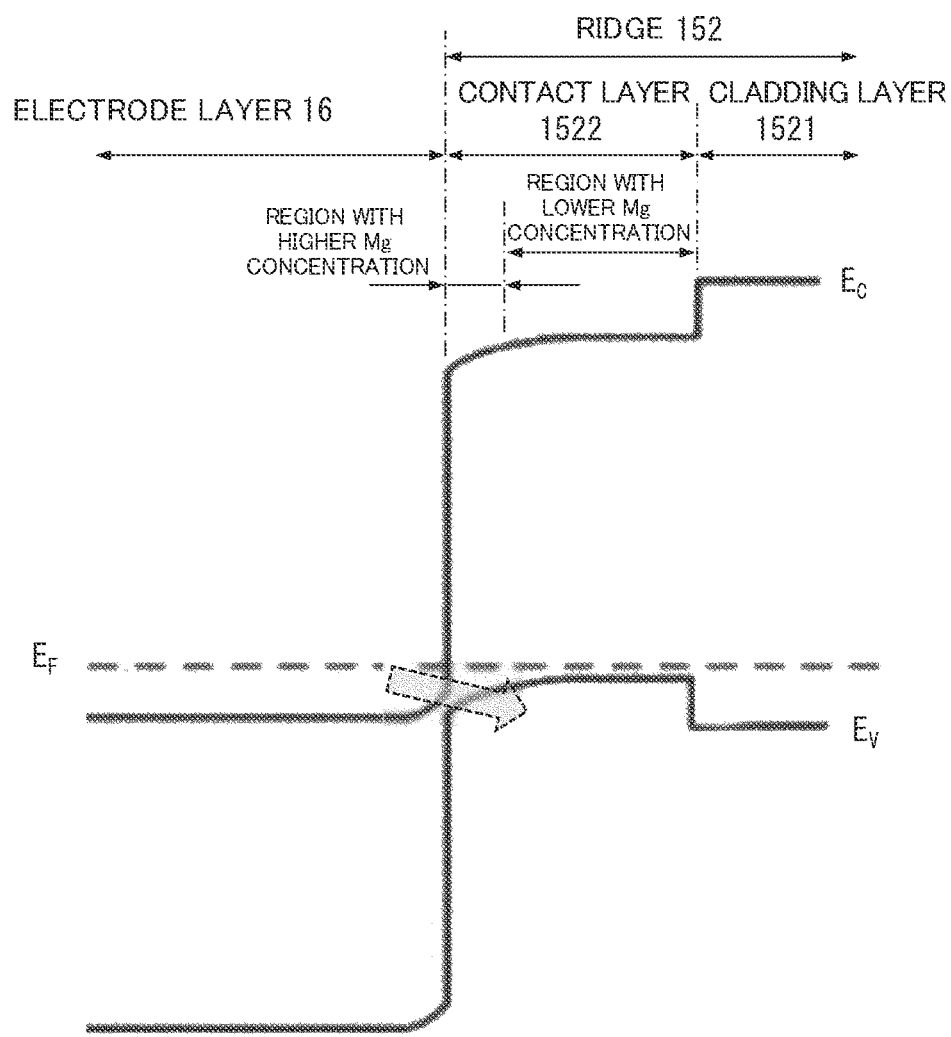
FIG. 4 is a schematic band chart for an electrode-layer/ridge junction in one of principal surfaces of the ridge on a side opposite to a substrate.
Figure 5:
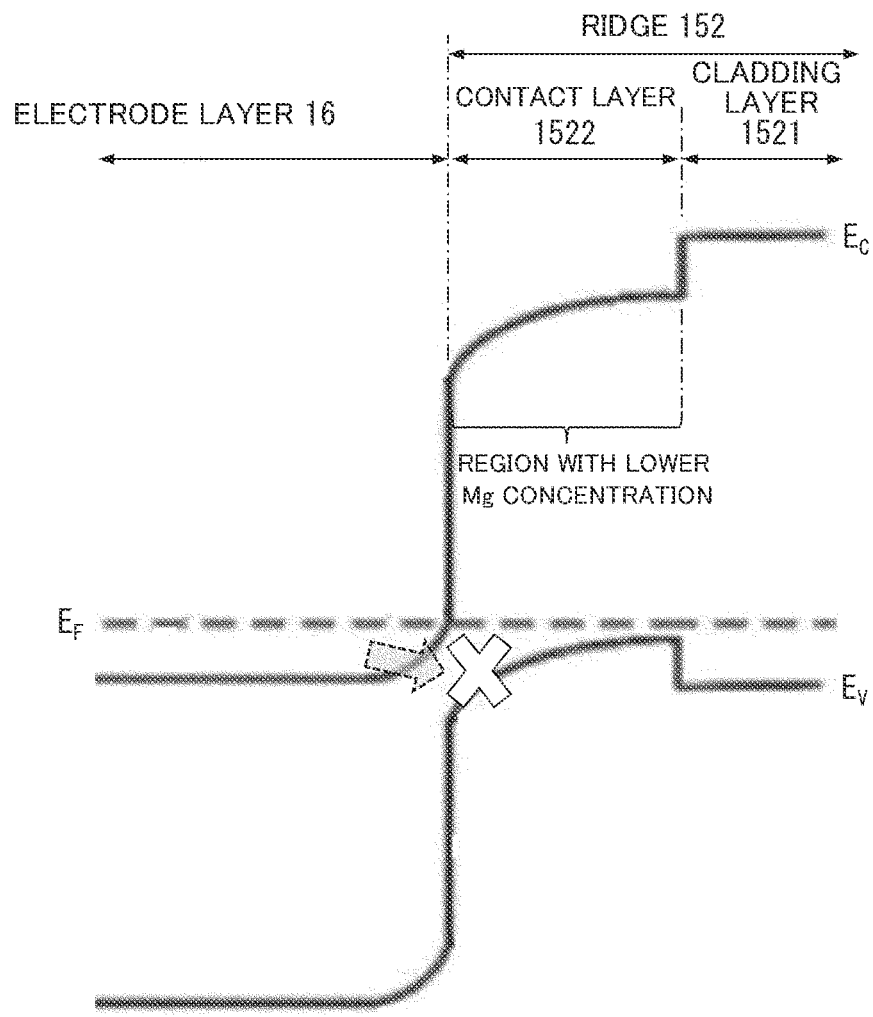
FIG. 5 is a schematic band chart for an electrode-layer/ridge junction in a surface of a stepped portion formed in the one of the principal surfaces of the ridge on the side opposite to the substrate.
Figure 6:
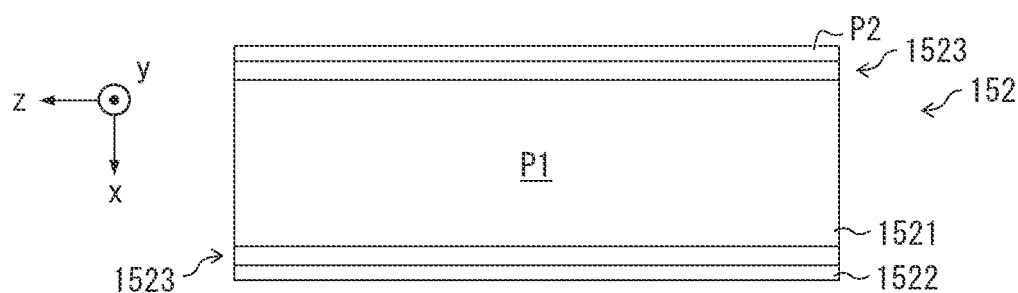
FIG. 6 is a plan view of the ridge included in the p-type semiconductor layer illustrated in FIG. 2.
Figure 7:
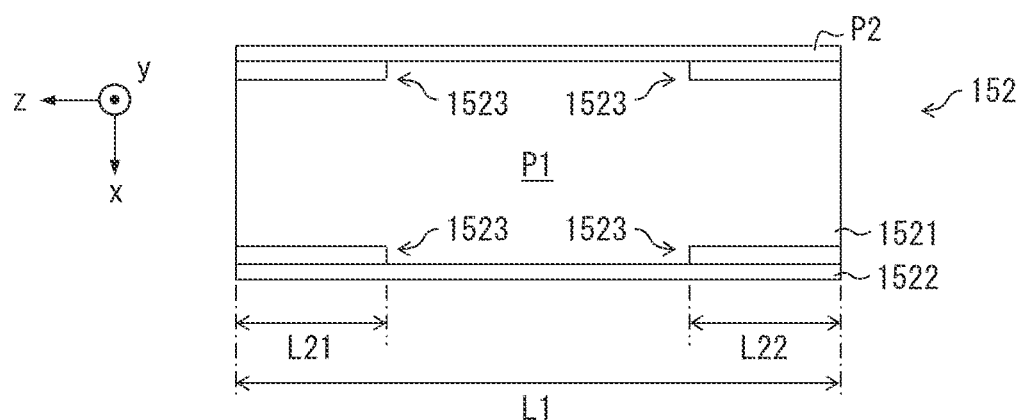
FIG. 7 is a plan view of a modification of the ridge illustrated in FIG. 3.

A laser element 10 according to a first embodiment of the present disclosure will be described below with reference to FIGS. 1 to 7. FIG. 1 is a front view of the laser element 10. FIG. 1 illustrates one end surface of the laser element 10 from which a laser beam is emitted. FIG. 2 is a perspective view of a p-type semiconductor layer 15 included in the laser element 10. FIG. 3 is a graph depicting a distribution of Mg concentration in a ridge 152 included in the p-type semiconductor layer 15. FIG. 4 is a schematic band chart for a junction between an electrode layer 16 and the ridge 152 in one P1 of principal surfaces of the ridge 152 on a side opposite to a substrate 12. FIG. 5 is a schematic band chart for the junction between the electrode layer 16 and the ridge 152 in a surface of a stepped portion 1523 formed in the principal surface P1. FIG. 6 is a plan view of the ridge 152 included in the p-type semiconductor layer 15. FIG. 7 is a plan view of a modification of the ridge 152.

As illustrated in FIG. 1, the laser element 10 includes an electrode layer 11, the substrate 12, an n-type semiconductor layer 13, a light emitting layer 14, the p-type semiconductor layer 15, the electrode layer 16, and a dielectric layer 17.

The n-type semiconductor layer 13, the light emitting layer 14, the p-type semiconductor layer 15, the electrode layer 16, and the dielectric layer 17 are laminated on the one principal surface of the substrate 12 (namely, the principal surface on a y-axis positive side in an orthogonal coordinate system illustrated in FIG. 1) in order mentioned. The electrode layer 11 is formed on the other principal surface of the substrate 12 (namely, the principal surface on a y-axis negative side in the orthogonal coordinate system illustrated in FIG. 1).

FIG. 1 illustrates the laser element 10 in which the electrode layer 11 is positioned on a lower side of the substrate 12 while the n-type semiconductor layer 13, the light emitting layer 14, the p-type semiconductor layer 15, the electrode layer 16, and the dielectric layer 17 are positioned on an upper side of the substrate 12.

In FIG. 1, a direction parallel to a normal line to the principal surface of the substrate 12 is defined as a y-axis direction, a direction perpendicular to the y-axis direction and parallel to the one end surface of the laser element 10 is defined as an x-axis direction, and one of in-plane directions of the principal surface of the substrate 12, the one being perpendicular to the one end surface, is defined as a z-axis direction. In FIG. 1, of the y-axis direction, a direction toward the light emitting layer 14 from the substrate 12 (namely, an upward direction in FIG. 1) is defined as the y-axis positive direction. Of the x-axis direction, a direction toward the left from the right in FIG. 1 is defined as an x-axis positive direction. Of the z-axis direction, a direction toward a front side from a back side of the drawing sheet of FIG. 1 is defined as a z-axis positive direction.

In the drawings described blow, a length (dimension along the z-axis direction), a width (dimension along the x-axis direction), and a thickness (dimension along the y-axis direction) of the laser element 10 do not exactly represent a magnitude relation among the actual dimensions. Particularly, the thickness is illustrated in an exaggerated size in comparison with the length and the width.

Substrate

The substrate 12 is a plate-shaped member made of a nitride semiconductor represented by GaN or AlGaN (see FIG. 1). When AlGaN is used as the nitride semiconductor forming the substrate 12, the substrate 12 functions as a cladding. Accordingly, comparing with the case of using GaN as the nitride semiconductor, light propagating within a resonator described lager can be suppressed from leaking to the substrate 12.

When AlGaN is used as the nitride semiconductor, an Al composition ratio in the AlGaN is preferably about 7% or less. A plane orientation defining the principal surface of the substrate 12 may be a (0001) face that is a polar face, a (1-100) face that is a non-polar face, or a (11-22) face that is a semi-polar face.

In this embodiment, a plate-shaped member made of AlGaN and having a principal surface defined by the plane orientation of the (0001) face is used as the substrate 12.

N-Side Electrode Layer

The electrode layer 11 is an n-side one of a pair of electrode layers for supplying a current to the laser element 10 (see FIG. 1). The electrode layer 11 is a thin film made of a conductor and formed on the principal surface of the substrate 12 on a y-axis negative direction side. The conductor forming the electrode layer 11 is not limited and can be selected as appropriate from metals and conductive oxides. The electrode layer 11 may be a single-layer film made of one conductor or a multilayer film including multiple layers made of different types of conductors.

In this embodiment, a thin film made of gold is used as the electrode layer 11.

N-Type Semiconductor Layer

The n-type semiconductor layer 13 is a film made of an n-type nitride semiconductor and formed on the principal surface of the substrate 12 on the y-axis positive direction side (see FIG. 1). At least one among AlGaN doped with Si, GaN doped with Si, AlInGaN doped with Si, and InGaN doped with Si may be used as the n-type nitride semiconductor forming the n-type semiconductor layer 13. Si functions as an n-type dopant for the nitride semiconductor.

The n-type semiconductor layer 13 may be a single-layer film made of one type among the above-mentioned nitride semiconductors or a multilayer film including multiple layers made of different types among the above-mentioned nitride semiconductors.

A refractive index of the n-type semiconductor layer 13 is smaller than that of the light emitting layer 14 described later. Accordingly, the n-type semiconductor layer 13 functions as a cladding to confine light in the light emitting layer 14.

In this embodiment, a multilayer film including three layers made of GaN doped with Si, AlGaN doped with Si, and GaN doped with Si is used as the n-type semiconductor layer 13.

Light Emitting Layer

The light emitting layer 14 is a multilayer film made of a nitride semiconductor and laminated on a principal surface of the n-type semiconductor layer 13 on the y-axis positive direction side (see FIG. 1). The light emitting layer 14 includes the number n (n is two or more integer) of well layers and the number n−1 of barrier layers and has a structure that the well layers and the barrier layers are alternately laminated. In FIG. 1, the multilayer structure of the light emitting layer 14 is not illustrated.

InGaN can be used as the nitride semiconductor forming the well layers. Any one among GaN, InGaN, and AlGaN can be used as the nitride semiconductor forming the barrier layers. Detailed matters (such as the types of the nitride semiconductors forming the individual layers and thicknesses of the individual layers) of the well layers and the barrier layers are not limited, and they can be selected as appropriate from the matters known in light emitting layers of the related art.

In this embodiment, InGaN with an In composition of about 15% is used as the nitride semiconductor forming the well layers, and InGaN with an In composition of about 0 to 5% is used as the nitride semiconductor forming the barrier layers.

P-Type Semiconductor Layer

The p-type semiconductor layer 15 is obtained by microprocessing a multilayer film made of a p-type nitride semiconductor and laminated on a principal surface of the light emitting layer 14 on the y-axis positive direction side, thereby shaping the multilayer film into the form illustrated in FIGS. 1 and 2.

At least one among AlGaN doped with Mg, GaN doped with Mg, AlInGaN doped with Mg, and InGaN doped with Mg may be used as the p-type nitride semiconductor forming the p-type semiconductor layer 15. Mg functions as a p-type dopant for the nitride semiconductor.

The p-type semiconductor layer 15 includes a plate 151 with a uniform thickness, and the ridge 152 raised in the substantially stripe shape from the plate 151. As illustrated in FIG. 2, the ridge 152 extends parallel to the z-axis direction.

The ridge 152 includes a cladding layer 1521 and a contact layer 1522. The cladding layer 1521 is laminated on a principal surface of the plate 151 on the y-axis positive direction side. The contact layer 1522 is laminated on a principal surface of the cladding layer 1521 on the y-axis positive direction side. In other words, the contact layer 1522 is disposed on the principal surface P1 of the ridge 152, namely one principal surface of the ridge 152 (principal surface on the y-axis positive direction side).

In this embodiment, $Al_xGa_{1-x}N$ (0≤x≤0.055) containing Mg is used as the nitride semiconductor forming the plate 151 and the cladding layer 1521.

Like the refractive index of the n-type semiconductor layer 13, a refractive index of each of the plate 151 and the cladding layer 1521 is smaller than that of the light emitting layer 14. Accordingly, each of the plate 151 and the cladding layer 1521 functions as a cladding to confine the light in the light emitting layer 14. The p-type semiconductor layer 15 including the plate 151 and the cladding layer 1521 constitutes a resonator of the laser element 10 in cooperation with the n-type semiconductor layer 13 and the light emitting layer 14 described above.

The sum of thicknesses of the plate 151 and the cladding layer 1521 is not limited to a specific value but is preferably about 350 nm or less. By reducing the sum of thicknesses of the plate 151 and the cladding layer 1521, an operating voltage of the laser element 10 can be lowered. Accordingly, the sum of thicknesses of the plate 151 and the cladding layer 1521 is preferably about 280 nm or less.

Furthermore, a layer functioning as a blocking layer is disposed in a layer forming part of the plate 151, the layer including one of principal surfaces of the plate 151 on a side closer to the light emitting layer 14 (namely, a principal surface of the plate 151 on the y-axis negative direction side). In this embodiment, $Al_xGa_{1-x}N$ (0≤x≤0.35) containing Mg is used as the nitride semiconductor forming the layer functioning as the blocking layer. In FIGS. 1 and 2, the above-mentioned layer in the plate 151 is not illustrated.

In this embodiment, $In_xAl_yGa_{1-x-y}N$ (0≤x<0.015, 0≤y<0.1) containing Mg is used as the nitride semiconductor forming the contact layer 1522. The contact layer 1522 has a function of reducing contact resistance that may generate at an interface between the p-type semiconductor layer 15 and the electrode layer 16 described later.

A thickness of the contact layer 1522 is not limited to a specific value but is desirably about 20 nm or less. By reducing the thickness of the contact layer 1522, the operating voltage of the laser element 10 can be lowered. Accordingly, the thicknesses of the contact layer 1522 is more preferably about 10 nm or less.

To reduce the contact resistance with respect to the electrode layer 16, the contact layer 1522 contains Mg as the dopant at a higher concentration than the plate 151 and the cladding layer 1521. More specifically, in the principal surface P1 of the ridge 152, the concentration of Mg is preferably about $1 \times 10^{19}$ cm$^{-3}$ or higher and more preferably about $3 \times 10^{19}$ cm$^{-3}$ or higher. As the concentration of Mg in the principal surface P1 increases, the above-mentioned contact resistance can be further reduced, and hence the operating voltage of the laser element 10 can be held at a lower level.

To add Mg to the contact layer 1522 at the high concentration, the substrate 12 including the n-type semiconductor layer 13, the light emitting layer 14, and the p-type semiconductor layer 15 laminated thereon may be annealed in a Mg-containing atmosphere after crystal growth of the contact layer 1522. With the annealing, Mg is diffused into the contact layer 1522 from the principal surface P1. According to the above method, because of utilizing diffusion of Mg, the concentration of Mg added to the contact layer 1522 is maximum in the principal surface P1 and gradually reduces as a distance from the principal surface P1 increases toward the inner side of the contact layer 1522.

In an example illustrated in FIG. 3, the substrate 12 including the n-type semiconductor layer 13, the light emitting layer 14, and the p-type semiconductor layer 15 laminated thereon is annealed, by way of example, at 900° C. for 10 minutes while a charging flow rate of Mg is set such that the concentration of Mg in the principal surface P1 becomes $3\times10^{19}$ cm$^{-3}$. In the contact layer 1522 obtained with the above-mentioned annealing, it has been found that the concentration of Mg in the principal surface P1 is about $3\times10^{19}$ cm$^{-3}$, and that the concentration of Mg at a position away from the principal surface P1 through 2 nm is about $7\times10^{18}$ cm$^{-3}$.

FIGS. 4 and 5 schematically illustrate bands in the junction between the electrode layer 16 and the ridge 152, that junction being obtained with the above-described annealing. FIG. 4 is the schematic band chart for the junction when the electrode layer 16 is in contact with the ridge 152 in the principal surface P1. FIG. 5 is a schematic band chart for the junction when the electrode layer 16 is in contact with the ridge 152 in the surface of the stepped portion 1523. In FIGS. 4 and 5, the leftward direction and the rightward direction in each band chart correspond respectively to the y-axis positive direction and the y-axis negative direction in the coordinate system illustrated in FIG. 1.

As seen from the case in which the distance from the principal surface P1 is 0 nm in the graph illustrated in FIG. 3, the concentration of Mg in the principal surface P1 is higher than $1\times10^{19}$ cm$^{-3}$ (about $3\times10^{19}$ cm$^{-3}$ in this embodiment). Therefore, a band end $E_V$ and a Fermi level $E_F$ are close to each other in the vicinity of the junction interface when the electrode layer 16 is in contact with the ridge 152 in the principal surface P1 (see FIG. 4). As a result, a tunneling probability from the electrode layer 16 to the contact layer 1522 is sufficiently high. Thus, a current flows from the electrode layer 16 toward the contact layer 1522.

On the other hand, as seen from the case in which the distance from the principal surface P1 is 2 nm in the graph illustrated in FIG. 3, the concentration of Mg in the surface of the stepped portion 1523 is lower than $1\times10^{19}$ cm$^{-3}$. Therefore, in the vicinity of the junction interface when the electrode layer 16 is in contact with the ridge 152 in the surface of the stepped portion 1523, the band end $E_V$ and the Fermi level $E_F$ are further apart from each other than in the case illustrated in FIG. 4 (see FIG. 5). As a result, the tunneling probability from the electrode layer 16 to the contact layer 1522 is low. Thus, a current does not flow from the electrode layer 16 toward the contact layer 1522.

The contact resistance between the contact layer 1522 and the electrode layer 16 described later has a negative relation to the concentration of Mg in the surface of the contact layer 1522 with which the electrode layer 16 is in contact. In other words, the contact resistance reduces as the concentration of Mg increases. In the laser element 10, two regions different in the concentration of Mg can be optionally formed in a surface of the contact layer 1522 in contact with the electrode layer 16 by forming the stepped portion 1523 at a boundary between the principal surface P1 and the lateral surface P2. This implies that two regions different in the contact resistance with respect to the electrode layer 16 can be optionally formed in the surface of the contact layer 1522. Thus, the above point implies that a region into which the current is to be injected and a region into which the current is not to be injected can be selectively set in the surface of the contact layer 1522. In this embodiment, the vicinity of each of a pair of boundary lines LB, namely a pair of boundaries between the principal surface P1 and the lateral surface P2, is selected as the region into which the current is not to be injected.

In the ridge 152, dangling bonds tend to generate in the lateral surface P2. Hence many non-radiative recombination levels due to the dangling bonds are formed near the lateral surface P2. When the stepped portion 1523 is not provided in the laser element, the current injected into the vicinity of the boundary line LB flows along the lateral surface P2. Accordingly, the current injected into the vicinity of the boundary line LB produces the non-radiative recombination without contributing to light emission, thus becoming heat and dissipating. The heat generation due to the non-radiative recombination not only reduces the output of the laser element when the laser element is driven with predetermined electric power, but also causes crystal defects near the lateral surface P2. Those crystal defects lead to a reduction in reliability of the laser element.

In the laser element 10, since the stepped portion 1523 is formed in the contact layer 1522, the current injected into the vicinity of the lateral surface P2 can be suppressed. As a result, the output (namely, drive efficiency) of the laser element 10 when the laser element is driven with the predetermined electric power can be increased, and reliability of the laser element can also be increased.

As described later in connection with a manufacturing method, when the laser element 10 includes a metal electrode layer covering the electrode layer 16, additional annealing is carried out after forming the metal electrode layer. With the above annealing, Mg added to the contact layer 1522 is further diffused. Accordingly, the charging flow rate of Mg is desired to be determined in consideration of the above annealing as well.

When looking at the principal surface P1 of the ridge 152 in the plan view from the y-axis positive direction side, a pair of ones among surfaces defining outer edges of the ridge 152, the pair of surfaces extending in a lengthwise direction of the ridge 152 (namely, a direction in which the ridge 152 extends), form the pair of lateral surfaces P2 of the ridge 152. In this embodiment, the lengthwise direction of the ridge 152 is the z-axis direction in the coordinate system illustrated in FIG. 2. Moreover, a pair of ones among the surfaces defining the outer edges of the ridge 152, the pair of surfaces intersecting the lengthwise direction of the ridge, form parts of both ends of the resonator.

In this embodiment, the stepped portion 1523 is formed over the entire boundary between the principal surface P1 and the lateral surface P2 (see FIG. 6). The boundary line LB illustrated in FIG. 2 is denoted by a dotted line indicating a ridge line that is present at the boundary between the principal surface P1 and the lateral surface P2.

However, a region of the boundary where the stepped portion 1523 is formed is not limited to the entirety of the boundary, namely to the case illustrated in FIG. 6. As illustrated in FIG. 7, the stepped portion 1523 may be formed in part of the boundary between the principal surface P1 and the lateral surface P2. In such a case, the stepped portion 1523 is desired to be formed in each of portions including ends of the boundary in the lengthwise direction (namely, an end of the boundary in the z-axis positive direction and an end of the boundary in the z-axis negative direction). Stated in another way, part of the boundary where the stepped portion 1523 is not formed is desired to be a central portion of the boundary in the lengthwise direction. Furthermore, in the above case, a length of the portions of the boundary where the stepped portion 1523 is formed (namely, the sum of a length L21 and a length L22) is preferably about 50% or more of a length L1 of the ridge 152 in the lengthwise direction.

A height h (see FIG. 1) of the stepped portion 1523 is preferably about 2 nm or more. As described above with reference to FIG. 3, Mg is assumed to be added to the contact layer 1522 such that the concentration of Mg in the principal surface P1 becomes about $3\times10^{19}$ cm$^{-3}$. In such a case, it has been found that the concentration of Mg at the position where the distance from the principal surface P1 is 2 nm is about $7\times10^{18}$ cm$^{-3}$ and is lower than $1\times10^{19}$ cm$^{-3}$.

When the electrode layer 16 described later is brought into contact with the surface of the contact layer 1522 where the concentration of Mg is about $1\times10^{19}$ cm$^{-3}$, satisfactory contact resistance is obtained. Accordingly, the electrode layer 16 enables the current to be injected into the contact layer 1522 under a condition of a small loss.

On the other hand, when the electrode layer 16 is brought into contact with a surface where the concentration of Mg is about $1\times10^{19}$ cm$^{-3}$ or lower, the satisfactory contact resistance is not obtained. Accordingly, the electrode layer 16 causes a large loss when the current is injected into the contact layer 1522, or does not allow any current to be injected into the contact layer 1522.

As understood from the above-described knowledge, by setting the height h to about 2 nm or more, the laser element 10 can suppress the current from being injected into the surface of the stepped portion 1523 while allowing the current to be injected from the electrode layer 16 into the principal surface P1 where the stepped portion 1523 is not formed.

Electrode Layer

The electrode layer 16 is a p-side one of the pair of electrodes for supplying the current to the laser element (see FIG. 1). The electrode layer 16 is a thin film made of a conductor and laminated on the surfaces of the principal surface P1 and the stepped portions 1523 of the ridge 152. The conductor forming the electrode layer 16 is not limited. The conductor forming the electrode layer 16 can be selected as appropriate from metals represented by Pd, Ni and Mo, for example, and conductive oxides represented by ITO, IZO, and ZnO, for example. The electrode layer 16 may be a single-layer film made of one conductor or a multilayer film including multiple layers made of different types of conductors. In this embodiment, a thin film made of ITO is used as the electrode layer 16.

In this embodiment, the electrode layer 16 covers the surfaces of the principal surface P1 and the stepped portions 1523 of the ridge 152. Since the contact resistance at the interface between the surface of each stepped portion 1523 and the electrode layer 16 is high as described above, the ridge 152 and the electrode layer 16 are conducted to each other substantially only through the interface between the principal surface P1 and the electrode layer 16.

Although not illustrated in FIG. 1, the metal electrode layer for connection of wirings may be further formed on a principal surface of the electrode layer 16 on the y-axis positive direction side.

Dielectric Layer

The dielectric layer 17 is a thin film made of a dielectric and laminated on the p-type semiconductor layer 15 to cover the principal surface of the plate 151 on the y-axis positive direction side, the lateral surfaces P2 of the ridge 152, and outer edge portions of the principal surface of the electrode layer 16 on the y-axis positive direction side. With the dielectric layer 17 covering the outer edge portions of the electrode layer 16, a region through which the current is injected into the contact layer 1522 can be restricted.

The dielectric forming the dielectric layer 17 is not limited and can be selected as appropriate from oxides represented by, for example, silicon oxide, aluminum oxide, titanium oxide, tantalum oxide, and zirconium oxide. In this embodiment, a thin film of silicon oxide is used as the dielectric layer 17.

Manufacturing Method

The manufacturing method for the laser element 10 will be described below. The manufacturing method for the laser element 10 includes a first film forming step, an annealing step, a microprocessing step, a second film forming step, and a third film forming step.

The first film forming step is a step of forming uniform solid films of the n-type semiconductor layer 13, the light emitting layer 14, and the p-type semiconductor layer 15 on the one principal surface of the substrate 12. Film forming conditions of the n-type semiconductor layer 13, the light emitting layer 14, and the p-type semiconductor layer 15 are not limited to specific ones and can be determined as appropriate. Accordingly, detailed description of the first film forming step in this embodiment is omitted.

The annealing step is performed after the first film forming step. The annealing step is a step of annealing, in an atmosphere containing Mg, the substrate 12 on which the n-type semiconductor layer 13, the light emitting layer 14, and the p-type semiconductor layer 15 are laminated. Annealing conditions used in the annealing step are determined to just satisfy that the concentration of Mg in the principal surface P1 of the contact layer 1522 after the annealing becomes about $1\times10^{19}$ cm$^{-3}$ or higher and preferably about $3\times10^{19}$ cm$^{-3}$ or higher. Accordingly, detailed description of the annealing step in this embodiment is omitted.

The microprocessing step is performed after the annealing step. The microprocessing step is a step of forming the ridge 152 in the p-type semiconductor layer 15 that is the uniform solid film, and further forming the stepped portion 1523 in the contact layer 1522 with a photolithography process.

In the microprocessing step, a first mask, namely a stripe-shaped mask corresponding to the shape of the ridge 152, is first formed on the one principal surface of the contact layer 1522 (namely, the principal surface of the contact layer on the y-axis positive direction side in the coordinate system illustrated in FIG. 1) with the aid of a photoresist. In this embodiment, a width of the first mask is set to about 30 μm.

Then, the one principal surface of the contact layer 1522 on which the first mask is formed is etched by using an RIE (Reactive Ion Etching) apparatus. With the etching, the ridge 152 is formed in the p-type semiconductor layer 15 that has been the uniform solid film so far. In this embodiment, the height of the ridge 152 is set to about 190 nm. Accordingly, a transverse sectional shape of the ridge 152 is given as a substantially trapezoidal shape in which a width of the principal surface P1 defining an upper base surface is about 30 μm and the height of the ridge is about 190 nm (see FIG. 1).

The first mask is removed with an organic solvent. Thereafter, a second mask, namely a stripe-shaped mask with a width of about 28 μm corresponding to the shape of the ridge 152, is formed on the surface of the p-type semiconductor layer 15 at a position corresponding to a center of the principal surface P1 with the aid of a photoresist.

Then, the surface of the p-type semiconductor layer 15 on which the second mask is formed is etched about 2 nm or more by using the RIE apparatus. With the above etching, the stepped portions 1523 are formed in the principal surface P1 of the contact layer 1522. In this embodiment, as illustrated in FIG. 2, the stepped portions 1523 with a width of about 1 μm and the height h of about 2 nm or more are formed over the entirety of the pair of boundaries between the lateral surfaces P2 and the principal surface P1 (namely, the boundaries on the x-axis positive direction side and the x-axis negative direction side in the coordinate system illustrated in FIG. 2). The second mask is removed with an organic solvent.

The second film forming step is performed after the microprocessing step. The second film forming step is a step of forming the electrode layer 16, the dielectric layer 17, and the metal electrode layer (not illustrated in FIG. 1) on the surface of the p-type semiconductor layer 15 including the ridge 152 with the stepped portion 1523 formed therein.

In the second film forming step, a uniform solid film of the electrode layer 16 is first formed on the surface of the p-type semiconductor layer 15 by using a vapor deposition apparatus. Any one of metals represented by Pd, Ni and Mo, for example, and conductive oxides represented by ITO, IZO, and ZnO, for example, can be used as the conductor forming the electrode layer 16. In this embodiment, ITO is used as the conductor forming the electrode layer 16.

Then, a photoresist is coated on a surface of the uniform solid film of the electrode layer 16, and a third mask, namely a stripe-shaped mask with a width of about 30 μm, is formed at a position corresponding to the principal surface P1.

The uniform solid film of the electrode layer 16 is etched by using the RIE apparatus. With this etching, the electrode layer 16 covering the principal surface P1 is formed on the principal surface P1.

Then, a uniform solid film of the dielectric layer 17 is formed on the surfaces of the p-type semiconductor layer 15 and the electrode layer 16 by using a CVD apparatus. The dielectric forming the dielectric layer 17 can be selected as appropriate from oxides represented by $SiO_2$, $Al_2O_3$, $TiO_2$, $Ta_2O_5$, and $ZrO_2$, for example. In this embodiment, $SiO_2$ is used as the dielectric forming the dielectric layer 17.

Then, a photoresist is coated on a surface of the uniform solid film of the dielectric layer 17, and a fourth mask including an opening with is a narrower width than the principal surface P1 is formed at a position corresponding to the principal surface P1.

Then, the surface of the dielectric layer 17 on which the fourth mask is formed is etched by wet etching. With this etching, an opening is formed in the dielectric layer 17, which has been the uniform solid film so far, at a position corresponding to the principal surface P1, and the electrode layer 16 is exposed. Thereafter, the fourth mask is removed with an organic solvent.

Then, a uniform solid film of the metal electrode layer is formed on the surfaces of the dielectric layer 17 and the electrode layer 16 exposed through the opening of the dielectric layer 17 by using the vapor deposition apparatus. A metal forming the metal electrode layer is not limited to a specific one, and titanium is used in this embodiment.

After forming the metal electrode layer, the laser element 10 is taken out from the vapor deposition apparatus and is annealed at temperature of several hundred ° C. With this annealing, the contact resistance at each of an interface between the contact layer 1522 and the electrode layer 16 and an interface between the electrode layer 16 and the metal electrode layer can be reduced, and hence the voltage to be applied at the time of injecting the current into the laser element 10 can be reduced.

The third film forming step is performed after annealing the laser element 10. The third film forming step is a step of forming the electrode layer 11 on the other principal surface of the substrate 12 (namely, the principal surface of the substrate on the y-axis negative direction side in the coordinate system illustrated in FIG. 1). Film forming conditions of the electrode layer 11 are not limited to specific ones and can be determined as appropriate. Accordingly, detailed description of the third film forming step in this embodiment is omitted. Through the above-described steps, the laser element 10 illustrated in FIG. 1 is completed.

Second Embodiment

Figure 8:
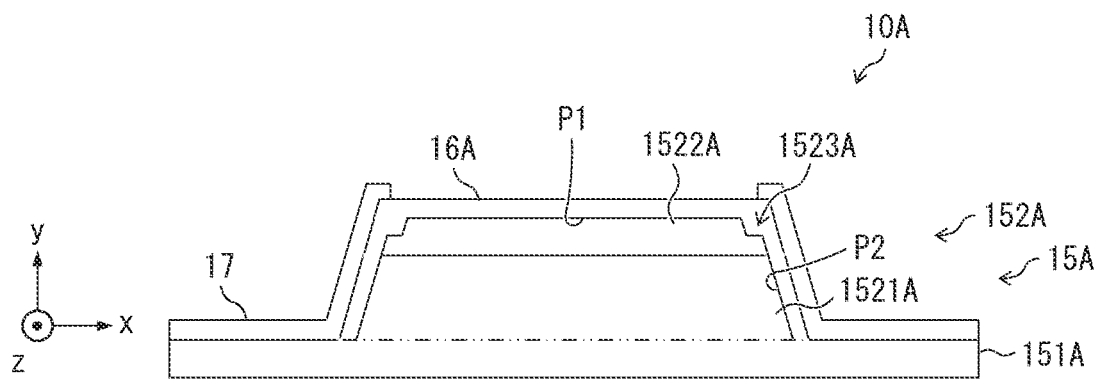
FIG. 8 is a front view of a laser element according to a second embodiment of the present disclosure.

A laser element 10A according to a second embodiment of the present disclosure will be described below with reference to FIG. 8. FIG. 8 is a front view of the laser element 10A.

The laser element 10A is obtained by replacing the electrode layer 16 with an electrode layer 16A based on the laser element 10 illustrated in FIG. 1. Accordingly, in this embodiment, only the electrode layer 16A is described, and description of other components is omitted. Moreover, in FIG. 8, the electrode layer 11, the substrate 12, the n-type semiconductor layer 13, and the light emitting layer 14 are omitted. For convenience of explanation, in the description of the laser element 10A, the p-type semiconductor layer 15 is read as a p-type semiconductor layer 15A, and a suffix "A" is added to each of reference numerals denoting components of the p-type semiconductor layer 15.

As illustrated in FIG. 8, the electrode layer 16A is formed to cover, in addition to a principal surface P1 and stepped portions 1523A of a ridge 152A, entire lateral surfaces P2 of the ridge 152A. A region of each of the lateral surfaces P2 to be covered by the electrode layer 16A is not limited to the entirety of each lateral surface P2 and may be part of each lateral surface P2. In other words, an end of the electrode layer 16A on a side closer to a plate 151A (namely, an end of the electrode layer 16A on a y-axis negative direction side in a coordinate system illustrated in FIG. 8) may be in contact with the plate 151A or may be positioned at an intermediate point of the lateral surface P2 without contacting the plate 151A.

Third Embodiment

Figure 9:
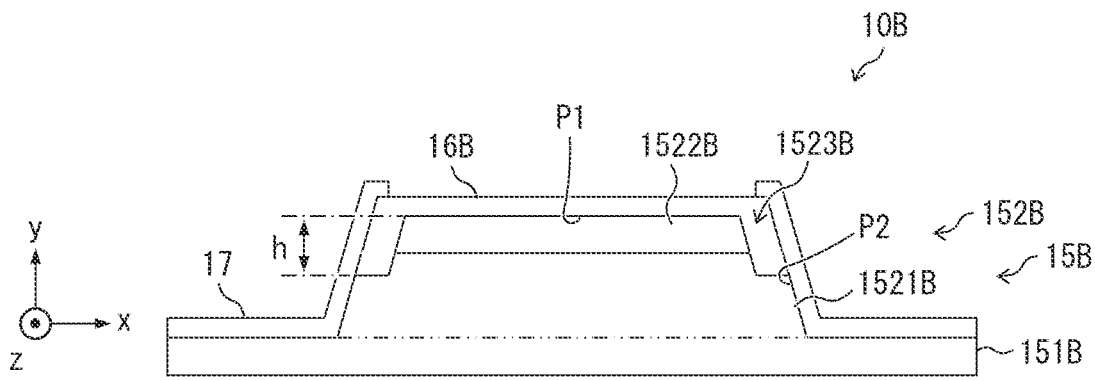
FIG. 9 is a front view of a laser element according to a third embodiment of the present disclosure.

A laser element 10B according to a third embodiment of the present disclosure will be described below with reference to FIG. 9. FIG. 9 is a front view of the laser element 10B.

The laser element 10B is obtained by replacing the p-type semiconductor layer 15 and the electrode layer 16 with a p-type semiconductor layer 15B and an electrode layer 16B, respectively, based on the laser element 10 illustrated in FIG. 1. Accordingly, in this embodiment, only the p-type semiconductor layer 15B and the electrode layer 16B are described, and description of other components is omitted. Moreover, in FIG. 9, the electrode layer 11, the substrate 12, the n-type semiconductor layer 13, and the light emitting layer 14 are omitted.

In the p-type semiconductor layer 15B, as illustrated in FIG. 9, a cladding layer 1521B made of a nitride semiconductor with a lower refractive index than the light emitting layer 14 is formed as a layer adjacent to a contact layer 1522B on a side closer to a plate 151B (namely, on a y-axis negative direction side in a coordinate system illustrated in FIG. 9). The above point is as per described in the first embodiment.

Stepped portions 1523B are each formed to extend from a principal surface P1 over a region spanning from the contact layer 1522B up to the cladding layer 1521B. Stated in another way, a height h of each stepped portion 1523B is determined to be greater than a thickness of the contact layer 1522B and smaller than a thickness of a ridge 152B.

Like the electrode layer 16, the electrode layer 16B is formed to cover the principal surface P1 and the stepped portions 1523B.

Fourth Embodiment

Figure 10:
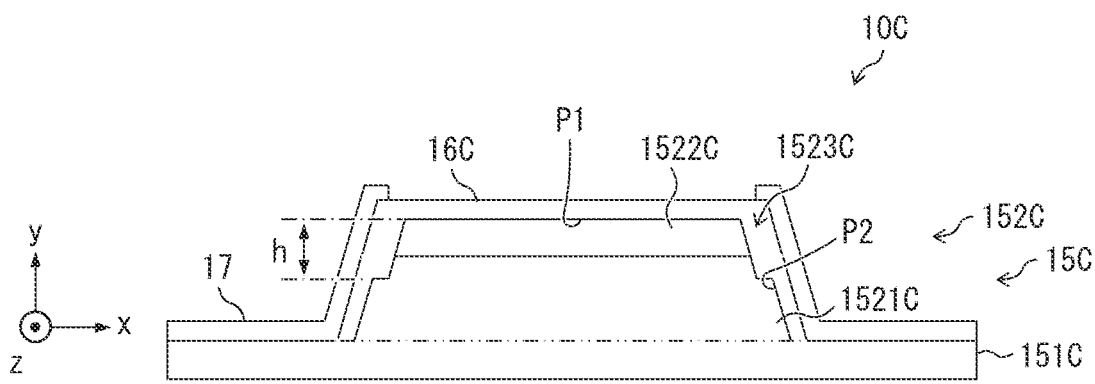
FIG. 10 is a front view of a laser element according to a fourth embodiment of the present disclosure.

A laser element 10C according to a fourth embodiment of the present disclosure will be described below with reference to FIG. 10. FIG. 10 is a front view of the laser element 10C.

The laser element 10C is obtained by replacing the p-type semiconductor layer 15 and the electrode layer 16 with a p-type semiconductor layer 15C and an electrode layer 16C, respectively, based on the laser element 10 illustrated in FIG. 1. Accordingly, in this embodiment, only the p-type semiconductor layer 15C and the electrode layer 16C are described, and description of other components is omitted. Moreover, in FIG. 10, the electrode layer 11, the substrate 12, the n-type semiconductor layer 13, and the light emitting layer 14 are omitted.

In the p-type semiconductor layer 15C, as illustrated in FIG. 10, a cladding layer 1521C made of a nitride semiconductor with a lower refractive index than the light emitting layer 14 is formed as a layer adjacent to a contact layer 1522C on a side closer to a plate 151C (namely, on a y-axis negative direction side in a coordinate system illustrated in FIG. 10). The above point is as per described in the first embodiment.

Stepped portions 1523C are each formed to extend from a principal surface P1 over a region spanning from the contact layer 1522C up to the cladding layer 1521C. Stated in another way, a height h of each stepped portion 1523C is determined to be greater than a thickness of the contact layer 1522C and smaller than a thickness of a ridge 152C.

As illustrated in FIG. 10, the electrode layer 16C is formed to cover, in addition to the principal surface P1 and the stepped portions 1523C of the ridge 152C, entire lateral surfaces P2 of the ridge 152C. Thus, the electrode layer 16C is formed like the electrode layer 16A illustrated in FIG. 8.

Recapitulation

The laser element 10, 10A, 10B, or 10C according to a first aspect of the present disclosure includes the substrate 12 and the n-type semiconductor layer 13, the light emitting layer 14, the p-type semiconductor layer 15, 15A, 15B, or 15C, and the electrode layer 16 that are successively laminated on one principal surface of the substrate 12.

In the laser element 10, 10A, 10B, or 10C, the p-type semiconductor layer 15, 15A, 15B, or 15C includes the ridge 152, 152A, 152B, or 152C raised in the stripe shape, the ridge 152, 152A, 152B, or 152C including the contact layer 1522, 1522A, 1522B, or 1522C formed in a layer including the principal surface P1 on the side opposite to the substrate 12, the stepped portion 1523, 1523A, 1523B, or 1523C defined by recessing the contact layer 1522, 1522A, 1522B, or 1522C, respectively, is formed in at least part of the boundary (denoted by the boundary line LB) between the lateral surface P2 and the principal surface P1, and the electrode layer 16 covers the principal surface P1 and the stepped portion 1523, 1523A, 1523B, or 1523C.

The lateral surface P2 is a one among the surfaces defining the outer edges of the ridge 152, 152A, 152B, or 152C, the one surface extending along the lengthwise direction of the ridge 152, 152A, 152B, or 152C (namely, in the z-axis direction in the coordinate system illustrated in each of FIGS. 1, 2, and 6 to 10).

To reduce the contact resistance between the p-type semiconductor layer and the electrode layer, the contact layer is formed in the layer of the ridge including the principal surface of the ridge. A carrier concentration in the contact layer is maximum in the principal surface of the ridge and gradually reduces as the distance from the principal surface of the ridge increases.

In the contact layer, therefore, the carrier concentration in the surface of the stepped portion is lower than that in the principal surface of the ridge. Stated in another way, the contact resistance between the surface of the stepped portion and the electrode layer is higher than that between the principal surface of the ridge and the electrode layer. Accordingly, the current supplied to the ridge from the electrode layer flows through the interface between the principal surface of the ridge and the electrode layer while avoiding the interface between the surface of the stepped portion and the electrode layer. The surface of the stepped portion is a surface that is exposed when part of the contact layer is recessed by, for example, etching.

With the above-described features, since the stepped portion is formed in at least part of the above-mentioned boundary, the current flowing through the lateral surface can be suppressed in comparison with a laser element in which the stepped portion is not formed. Thus, the laser element according to the first aspect can increase the drive efficiency and the reliability.

In the laser element 10, 10A, 10B, or 10C according to a second aspect of the present disclosure, in addition to the above-described features of the laser element 10, 10A, 10B, or 10C according to the first aspect, the stepped portion has the height h of about 2 nm or more.

With the above-described feature, in the contact layer, the carrier concentration in the surface of the stepped portion can be reduced without reducing the carrier concentration in the principal surface of the ridge. For example, the carrier concentration in the surface of the stepped portion can be reduced to be lower than $1 \times 10^{19}$ cm$^{-3}$ while the carrier concentration in the principal surface of the ridge is held at about $1 \times 10^{19}$ cm$^{-3}$ or higher. Thus, since the contact resistance between the principal surface of the ridge and the electrode layer can be increased to be sufficiently greater than that between the surface of the stepped portion and the electrode layer, the current flowing through the lateral surface can be reliably suppressed.

In the laser element 10, 10A, 10B, or 10C according to a third aspect of the present disclosure, in addition to the above-described features of the laser element 10, 10A, 10B, or 10C according to the first or second aspect, the stepped portion 1523, 1523A, 1523B, or 1523C is formed in a portion of the boundary (denoted by the boundary line LB), the portion including the end of the boundary in the lengthwise direction (namely, in the z-axis direction in the coordinate system illustrated in each of FIGS. 2, 6, and 7).

It has been found that, in the laser element not including the stepped portion, the current supplied from the electrode layer to the ridge tends to flow at a higher level near the end of the boundary and at a lower level near the center of the boundary in the lengthwise direction. With the above-described feature, since the stepped portion is formed in the part of the boundary, that part including the end of the boundary, the current flowing through the lateral surface can be more effectively suppressed than in the case in which the stepped portion is formed near the center of the boundary.

In the laser element 10, 10A, 10B, or 10C according to a fourth aspect of the present disclosure, in addition to the above-described features of the laser element 10, 10A, 10B, or 10C according to any one of the first to third aspects, the stepped portion 1523, 1523A, 1523B, or 1523C is formed over the entire boundary (denoted by the boundary line LB).

With the above-described feature, the current flowing through the lateral surface can be maximally suppressed.

In the laser element 10B or 10C according to a fifth aspect of the present disclosure, in addition to the above-described features of the laser element 10, 10A, 10B, or 10C according to any one of the first to fourth aspects, in the p-type semiconductor layer 15B or 15C including the ridge 152B or 152C, respectively, the cladding layer 1521B or 1521C with the lower refractive index than the light emitting layer 14 is disposed on the side closer to the light emitting layer 14 with respect to the contact layer 1522B or 1522C, and a recess defined by the stepped portion 1523B or 1523C extends from the principal surface P1 up to the cladding layer 1521B or 1521C.

With the above-described feature, since a laser beam propagating in the resonator constituted by the n-type semiconductor layer, the light emitting layer, and the p-type semiconductor layer can be confined more tightly, the laser beam can be suppressed from generating in higher-order modes.

In the laser element 10A or 10C according to a sixth aspect of the present disclosure, in addition to the above-described features of the laser element 10, 10A, 10B, or 10C according to any one of the first to fifth aspects, the electrode layer 16 covers at least part of the lateral surface P2 in addition to the principal surface P1 and the stepped portion 1523, 1523A, 1523B, or 1523C, and the laser element further includes the dielectric layer 17 covering the lateral surface P2 from above the electrode layer 16. In the above-described embodiments, each of the laser elements 10A and 10C employs the electrode layer 16 covering the entirety of the lateral surface P2.

When the dielectric layer is formed to directly cover the lateral surface of the ridge, there is a possibility that hydrogen generated from the dielectric layer may permeate into the ridge and may deteriorate the p-type semiconductor constituting the ridge. With the above-described feature, since the electrode layer covers at least part of the lateral surface, permeation of the hydrogen into the ridge can be suppressed.

In the laser element 10, 10A, 10B, or 10C according to one aspect of the present disclosure, in addition to the above-described features of the laser element 10, 10A, 10B, or 10C according to the first aspect, the contact layer 1522, 1522A, 1522B, or 1522C has a higher concentration of a P-type dopant (for example, Mg) than each of the other layers (the cladding layer 1521, 1521A, 1521B, or 1521C and the plate 151, 151A, 151B, or 151C) in the p-type semiconductor layer 15, 15A, 15B, or 15C except for the contact layer 1522, 1522A, 1522B, or 1522C.

Stated in another way, in the laser element 10, 10A, 10B, or 10C according to one aspect of the present disclosure, the p-type semiconductor layer 15, 15A, 15B, or 15C includes the ridge 152, 152A, 152B, or 152C raised in the stripe shape, the ridge 152, 152A, 152B, or 152C including the contact layer 1522, 1522A, 1522B, or 1522C formed in the layer including the principal surface P1 on the side opposite to the substrate 12, the contact layer 1522, 1522A, 1522B, or 1522C containing the P-type dopant added at a higher concentration than each of the other layers in the p-type semiconductor layer 15, 15A, 15B, or 15C except for the contact layer 1522, 1522A, 1522B, or 1522C.

The present disclosure contains subject matter related to that disclosed in Japanese Priority Patent Application JP 2020-191712 filed in the Japan Patent Office on Nov. 18, 2020, the entire contents of which are hereby incorporated by reference.

The one aspect of the present disclosure is not limited to the above-described embodiments and can be variously modified within the scope defined in Claims. Embodiments obtained by appropriately combining the techniques disclosed in the different embodiments also fall within the technical scope of the one aspect of the present disclosure. In addition, novel technical features can be provided by combining the techniques disclosed in the embodiments.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A laser element comprising:
a substrate;
an n-type semiconductor layer, a light emitting layer, a p-type semiconductor layer, and an electrode layer successively laminated on one principal surface of the substrate; and
a dielectric layer,
wherein the p-type semiconductor layer includes a ridge raised in a stripe shape, the ridge including a contact layer formed in a layer including a principal surface on a side opposite the substrate,
a stepped portion defined by recessing the contact layer is formed in at least part of a boundary between a lateral surface among surfaces defining outer edges of the ridge, the lateral surface extending along a lengthwise direction of the ridge, and the principal surface of the ridge,
the electrode layer directly covers the principal surface of the ridge and the stepped portion, and
the dielectric layer covers a region on the one principal surface of the substrate where the ridge does not exist, and covers an outer edge of the electrode layer, on a side opposite a part of the electrode layer that is in contact with the stepped portion, in a part of the electrode layer covering the stepped portion.

2. The laser element according to claim 1, wherein the stepped portion has a height of 2 nm or more.

3. The laser element according to claim 1, wherein the stepped portion is formed in a portion of the boundary, the portion including an end of the boundary in the lengthwise direction.

4. The laser element according to claim 1, wherein the stepped portion is formed over an entirety of the boundary.

5. The laser element according to claim 1, wherein the electrode layer covers at least part of the lateral surface in addition to the principal surface of the ridge and the stepped portion, and
the dielectric layer covers the lateral surface from above the lateral surface.

6. A laser element comprising:
a substrate; and an n-type semiconductor layer, a light emitting layer, a p-type semiconductor layer, and an electrode layer successively laminated on one principal surface of the substrate, wherein the p-type semiconductor layer includes a ridge raised in a stripe shape, the ridge including a contact layer formed in a layer including a principal surface on a side opposite the substrate, a stepped portion defined by recessing the contact layer is formed in at least part of a boundary between a lateral surface among surfaces defining outer edges of the ridge, the lateral surface extending along a lengthwise direction of the ridge, and the principal surface of the ridge, the electrode layer covers the principal surface of the ridge and the stepped portion, in the p-type semiconductor layer including the ridge, a cladding layer with a lower refractive index than the light emitting layer is disposed on a side closer to the light emitting layer with respect to the contact layer, and a recess defined by the stepped portion extends from the principal surface of the ridge up to the cladding layer.

7. The laser element according to claim 6, wherein the electrode layer covers at least part of the lateral surface in addition to the principal surface of the ridge and the stepped portion, and the laser element further includes a dielectric layer covering the lateral surface from above the lateral surface.

* * * * *